(12) United States Patent
Chen et al.

(10) Patent No.: US 11,721,597 B2
(45) Date of Patent: Aug. 8, 2023

(54) SEMICONDUCTOR DEVICE AND MANUFACTURING METHOD OF THE SAME

(71) Applicant: TAIWAN SEMICONDUCTOR MANUFACTURING COMPANY LTD., Hsinchu (TW)

(72) Inventors: Yang-Che Chen, Hsin-Chu (TW); Chen-Hua Lin, Yunlin County (TW); Victor Chiang Liang, Hsinchu (TW); Huang-Wen Tseng, Hsinchu County (TW); Chwen-Ming Liu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 144 days.

(21) Appl. No.: 17/461,479

(22) Filed: Aug. 30, 2021

(65) Prior Publication Data

US 2023/0064152 A1   Mar. 2, 2023

(51) Int. Cl.
*H01L 21/66* (2006.01)
*H01L 23/40* (2006.01)
*H01L 23/58* (2006.01)
*H01L 23/00* (2006.01)
*H01L 25/065* (2023.01)

(52) U.S. Cl.
CPC ............. *H01L 22/32* (2013.01); *H01L 22/14* (2013.01); *H01L 23/4006* (2013.01); *H01L 23/585* (2013.01); *H01L 24/20* (2013.01); *H01L 24/13* (2013.01); *H01L 25/0655* (2013.01); *H01L 2224/13024* (2013.01); *H01L 2224/221* (2013.01); *H01L 2224/2205* (2013.01)

(58) Field of Classification Search
CPC ..... H01L 22/32; H01L 22/14; H01L 23/4006; H01L 23/585; H01L 24/20; H01L 24/13; H01L 2224/13024; H01L 2224/2205; H01L 2224/221
USPC .......................................................... 438/18
See application file for complete search history.

(56) References Cited

U.S. PATENT DOCUMENTS

| | | | |
|---|---|---|---|
| 6,528,818 B1* | 3/2003 | Satya | H01L 22/34 257/758 |
| 9,741,667 B2* | 8/2017 | Zeng | H01L 22/34 |
| 11,088,037 B2* | 8/2021 | Chen | H01L 21/82 |
| 11,119,146 B1* | 9/2021 | Chong | H01L 22/14 |
| 2010/0314619 A1* | 12/2010 | Kaltalioglu | H01L 22/34 257/E21.585 |
| 2017/0323835 A1* | 11/2017 | Ogawa | H01L 23/562 |

(Continued)

*Primary Examiner* — Dao H Nguyen
(74) *Attorney, Agent, or Firm* — WPAT Law; Anthony King

(57) ABSTRACT

A semiconductor device and a method for detecting a defect in a semiconductor device are provided. The semiconductor device includes a packaging structure. The packaging structure includes a redistribution layer and a detecting component disposed in the redistribution layer. The semiconductor device further includes a cooling plate over the packaging structure and a fixing component penetrating through the packaging structure and the cooling plate. The packaging structure and the cooling plate are fixed by the fixing component. The detecting component is in a chain configuration having a ring shaped structure circling around the fixing component.

20 Claims, 11 Drawing Sheets

(56) References Cited

U.S. PATENT DOCUMENTS

2019/0011496 A1\* 1/2019 Van Gemert ........... H01L 22/34
2019/0088560 A1\* 3/2019 Newby .............. G01R 31/2831

\* cited by examiner

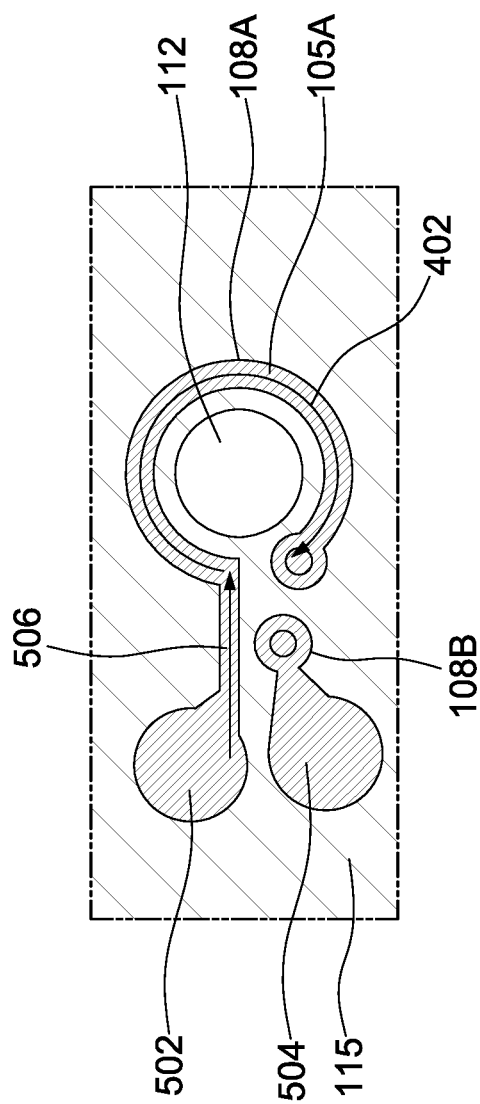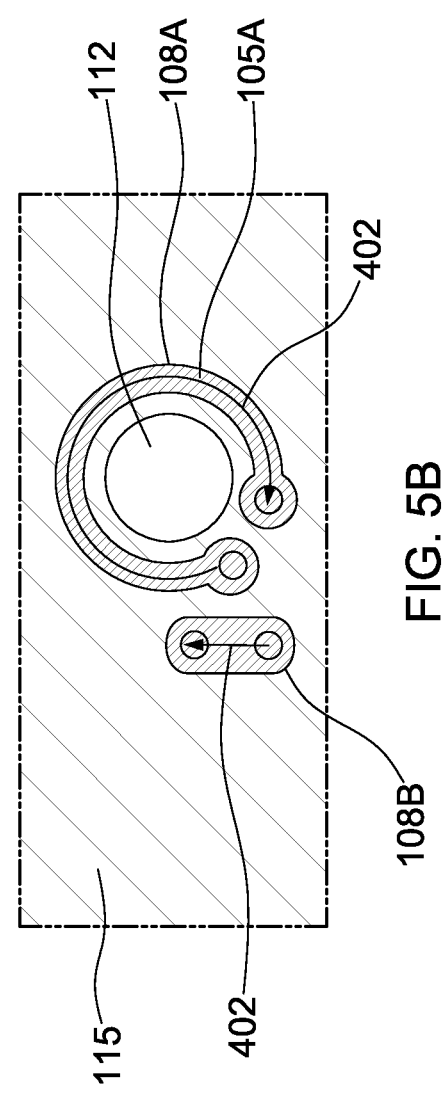
FIG. 5A
FIG. 5B

SEMICONDUCTOR DEVICE AND MANUFACTURING METHOD OF THE SAME

BACKGROUND

Semiconductor devices are used in a variety of electronic applications, such as personal computers, cell phones, digital cameras, and other electronic equipments. Many integrated circuits are typically manufactured on a single semiconductor wafer, and individual dies on the wafer are singulated by sawing between the integrated circuits along a scribe line. The individual dies are typically packaged separately, in multi-chip modules, or in other types of packaging, for example.

The semiconductor industry continues to improve the integration density of various electronic elements (e.g., transistors, diodes, resistors, capacitors, etc.) by continuous reductions in minimum feature size, which allow more components to be integrated into a given area. On the other hand, to further achieve an even higher integration density, the semiconductor industry is endeavoring to develop new packaging technologies, such as wafer-scale packaging technologies. The packaging technologies still need to be optimized to achieve higher yield and better performance of the semiconductor devices as well as to allow better integration of wafer testing.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5A is a top view of a portion of the semiconductor device cut through a line C-C' illustrated in FIG. 4, in accordance with some embodiments of the present disclosure.

FIG. 5B is a top view of a portion of the semiconductor device cut through a line D-D' illustrated in FIG. 4, in accordance with some embodiments of the present disclosure.

DETAILED DESCRIPTION

Figure 1A:
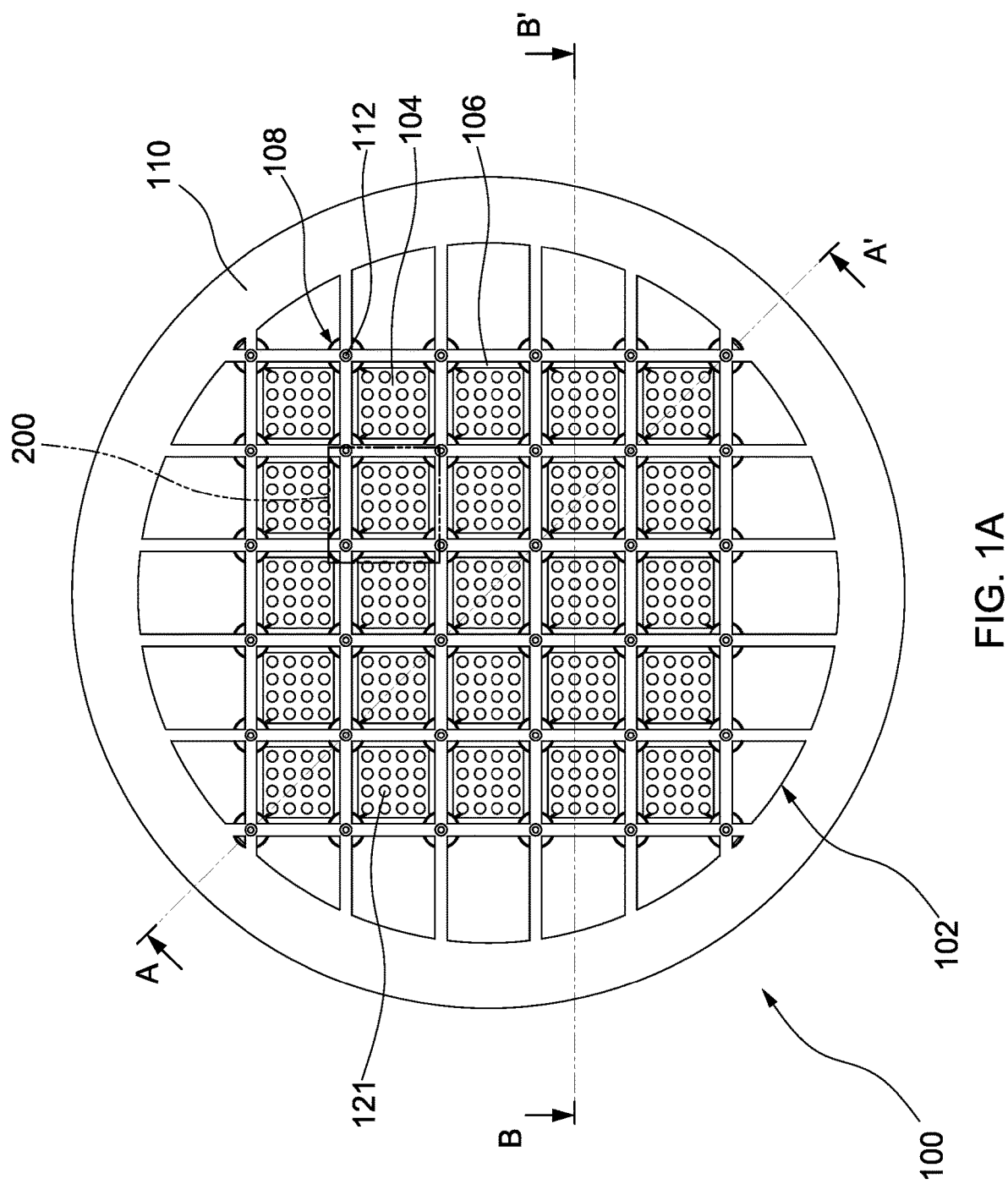
FIG. 1A is a schematic top view of a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second" and "third" describe various elements, components, regions, layers and/or sections, but these elements, components, regions, layers and/or sections should not be limited by these terms. These terms may be only used to distinguish one element, component, region, layer or section from another. The terms such as "first," "second" and "third" when used herein do not imply a sequence, order, or importance unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally means within a value or range (e.g., within 10%, 5%, 1%, or 0.5% of a given value or range) that can be contemplated by people having ordinary skill in the art. Alternatively, the term "substantially," "approximately" or "about" means within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another end point or between two endpoints. All ranges disclosed herein are inclusive of the endpoints, unless specified otherwise.

In some embodiments, a semiconductor device according to the present disclosure adopts a wafer-scale packaging technology such as a system-on-wafer (SoW) technology. In some embodiments, the semiconductor device includes a packaging structure having a plurality of dies, a molding adjacent to the dies, and a redistribution layer (RDL) over the dies and the molding. In some embodiments, the packaging structure includes an integrated fan-out (InFO) structure. In some embodiments, the semiconductor device is a high-power device and needs a cooling means to dissipate heat during operation. Examples of the cooling means include cooling plates. The cooling plates are fixed to an upper surface and a lower surface of the packaging structure by fixing components such as screws and/or bolts. The fixing components penetrate through drill holes of the cooling plates and of the packaging structure, thereby fixing the cooling plates and the packaging structure together. The cooling plates need to be fixed firmly to the packaging structure for optimal thermal dissipation.

However, defects, such as cracks, may be induced in the packaging structure near the drill holes by stress induced when forming the drill holes and fixing the cooling means, and when the packaging structure bends too much during a temperature cycle test. The defects, such as cracks, may spread out and damage conductive lines in the packaging structure (i.e., the conductive lines in the RDL of the package structure), thereby causing performance degradation of the semiconductor device or even total device failure. Such defects are hardly observed because they are hidden by the cooling plates or by the redistribution layer of the packaging structure. Manual inspection of the defects may not be practical or desirable due to inaccuracy, time consumption and labor requirement.

The present disclosure therefore provides a semiconductor device and a method for detecting a defect in a semiconductor device. The semiconductor device includes a packaging structure. The packaging structure includes a redistribution layer and a detecting component disposed in the redistribution layer. The semiconductor device further includes a cooling plate over the packaging structure and a fixing component penetrating through the packaging structure and the cooling plate. The packaging structure and the cooling plate are fixed by the fixing component. The detecting component is in a chain configuration having a ring shaped structure circling around the fixing component. By means of the detecting component, defects, such as cracks, can be detected electrically in an economical and accurate manner.

Figure 1B:
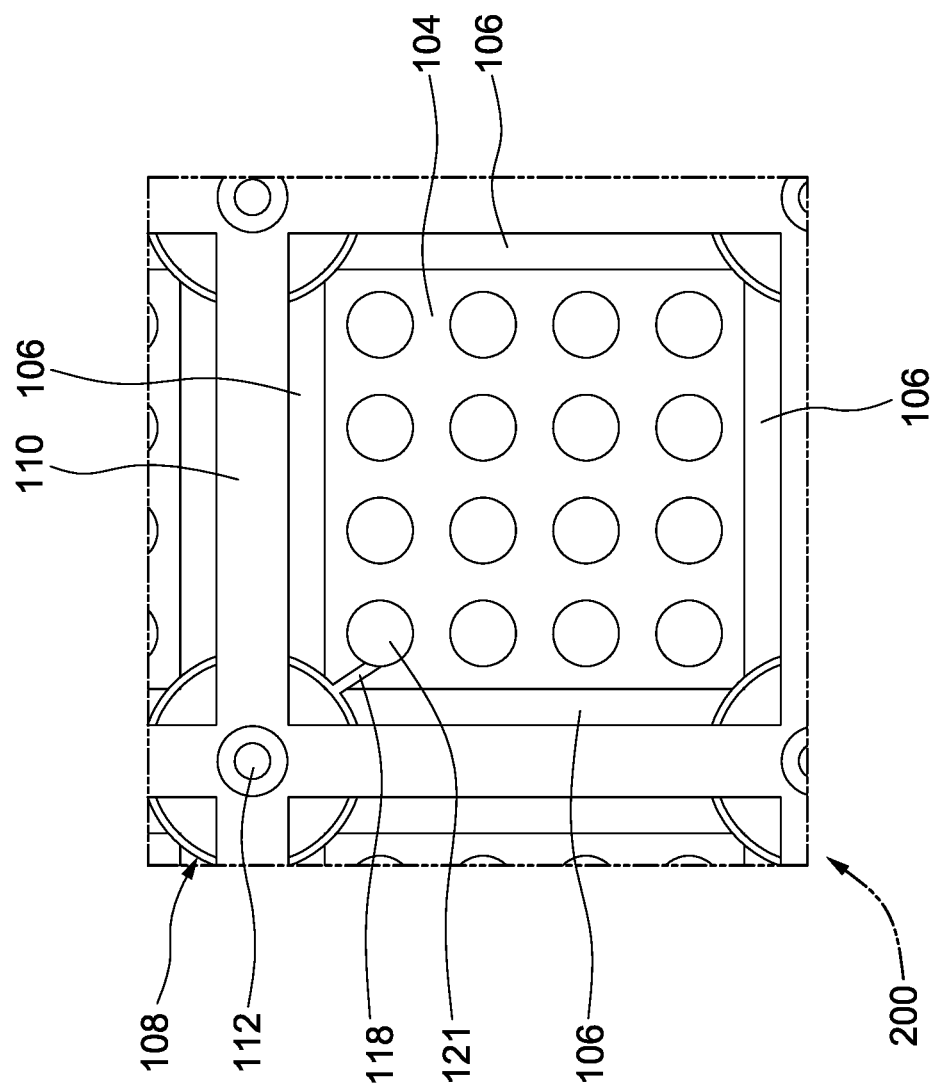
FIG. 1B is a magnified top view of a portion of the semiconductor device illustrated in FIG. 1A, in accordance with some embodiments of the present disclosure.
Figure 2:
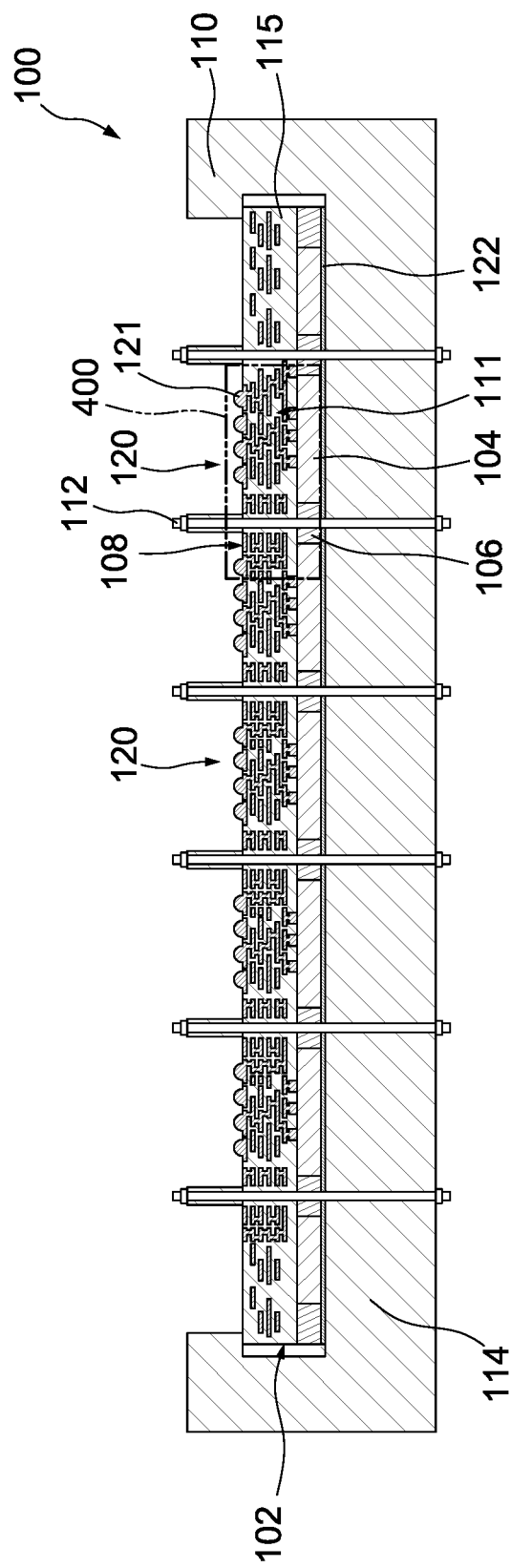
FIG. 2 is a schematic cross-sectional view of a semiconductor device taken along a line A-A' of FIG. 1A, in accordance with some embodiments of the present disclosure.
Figure 3:
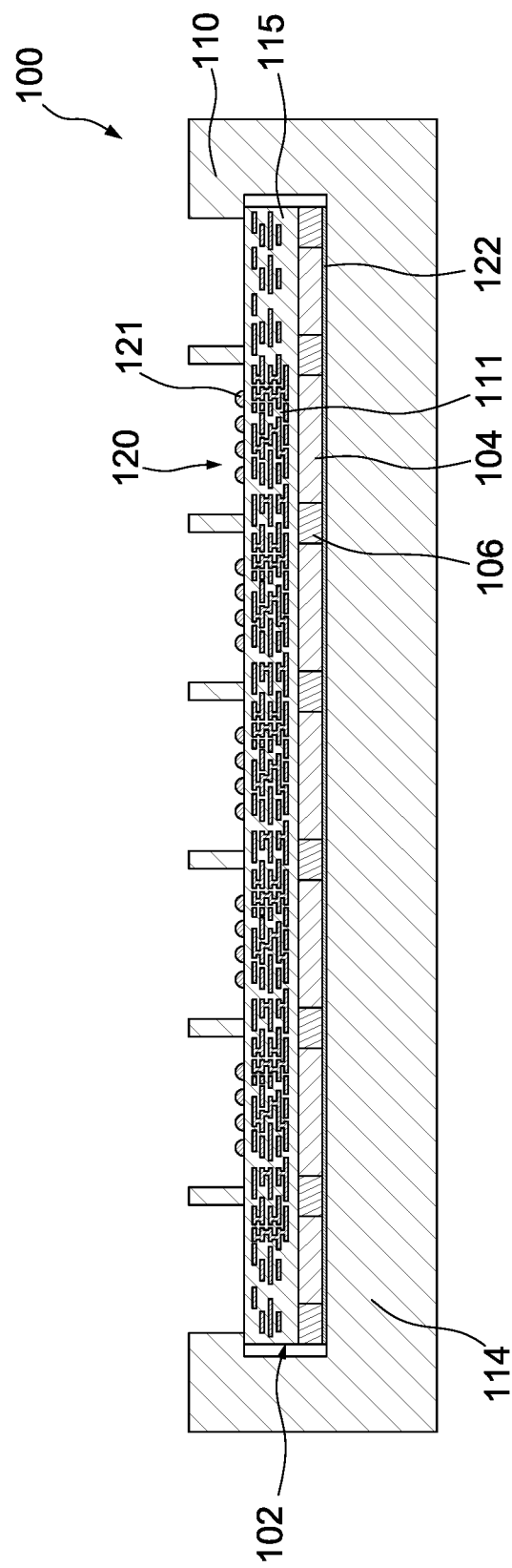
FIG. 3 is a schematic cross-sectional view of a semiconductor device taken along a line B-B' of FIG. 1A, in accordance with some embodiments of the present disclosure.

FIG. 1A illustrates a schematic top view of a semiconductor device 100 in accordance with some embodiments of the present disclosure. FIG. 11B is a magnified top view of a portion 200 of the semiconductor device 100 illustrated in FIG. 1A. FIG. 2 is a schematic cross-sectional view of the semiconductor device 100 taken along a line A-A' of FIG. 1A. FIG. 3 is a schematic cross-sectional view of the semiconductor device 100 taken along a line B-B' of FIG. 1A. Referring to FIGS. 1A, 1B, 2 and 3, a semiconductor device 100 includes a packaging structure 102, a top cooling plate 110, a bottom cooling plate 114, and a fixing component 112. The packaging structure 102 is sandwiched between the top cooling plate 110 and the bottom cooling plate 114 as shown in FIGS. 2 and 3. In some embodiments, a thermal interface material (TIM) layer 122 is disposed between the packaging structure 102 and the bottom cooling plate 114 for thermal dissipation. Examples of the thermal interface material include, but are not limited thereto, thermal paste, thermal adhesive, thermal gap filler, thermally conductive pad, thermal tape, phase change materials (PCM), and metal thermal interface materials. The fixing components 112 penetrate through the top cooling plate 110, the packaging structure 102 and the bottom cooling plate 114 and fix them together. In some embodiments, the fixing components 112 include screws, bolts, any other suitable fixing means, or a combination thereof. In some embodiments, the top cooling plate 110 and the bottom cooling plate 114 include a cooling means, such as water conduits, copper cold plates or the like, for dissipating heat from the packaging structure 102 during operation.

In some embodiments, the packaging structure 102 includes a plurality of dies 104 and molding 106 adjacent to the dies 104. In some embodiments, the dies 104 and the molding 106 may be referred to as a reconstructed wafer, but the disclosure is not limited thereto. In some embodiments, the top surface of the molding 106 is level with the top surface of the dies 106 as shown in FIG. 3. In some embodiments, the dies 104 include several interconnected electronic elements, such as transistors, diodes, capacitors, resistors, or the like. In some embodiments, the molding 106 includes a mixture of resins (e.g., phenolics, epoxies, polybutadienes, polyesters, or the like) and various additives (e.g., fillers, catalysts, thickeners, or the like). From a top view as illustrated in FIGS. 1A and 1B, each die 104 is surrounded by molding 106, and the fixing components 112 are disposed at the corners of each die 104. Although FIG. 1A illustrates that the fixing components 112 are disposed at each corner of each die 106, other suitable layouts are also contemplated within the scope of the present disclosure. For example, the fixing components 112 may be disposed at just some corners of some dies 106 to provide sufficient fixing force. From a cross-sectional view as illustrated in FIG. 2, the fixing components 112 penetrate through the molding 106 of the packaging structure 102.

As shown in FIGS. 2 and 3, the packaging structure 102 also includes a redistribution layer 111 over the dies 104 and the molding 106, and a detecting component 108 disposed in the redistribution layer 111. The fixing components 112 penetrate through the redistribution layer 111.

Figure 4:
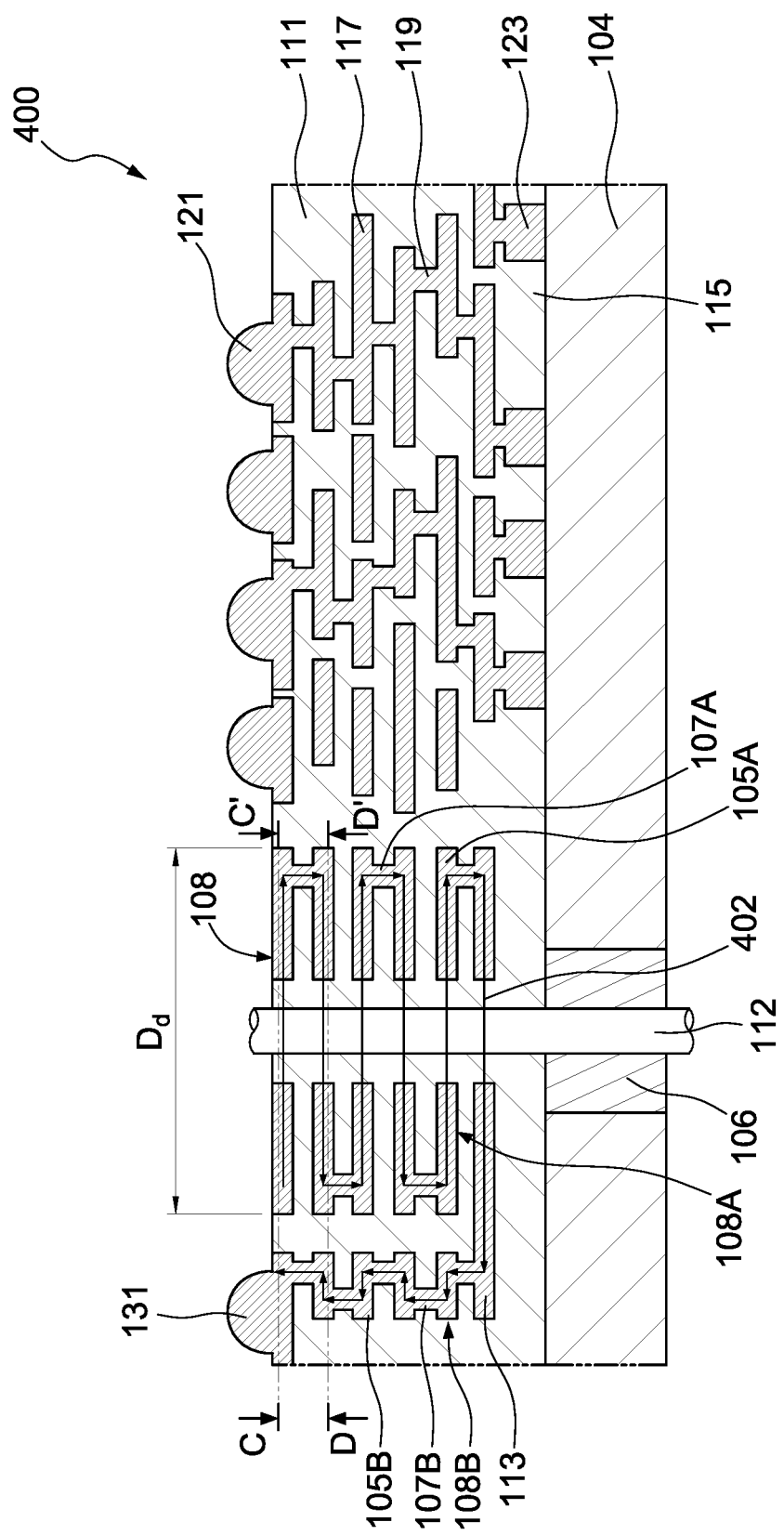
FIG. 4 is a magnified cross-sectional view of a portion of the semiconductor device illustrated in FIG. 2, in accordance with some embodiments of the present disclosure.

FIG. 4 is a magnified cross-sectional view of a portion 400 of the semiconductor device 100 illustrated in FIG. 2, in accordance with some embodiments of the present disclosure. As shown in FIG. 4, the redistribution layer 111 includes a plurality of first conductive layers 117 in stack and a plurality of first conductive vias 119 coupling the first conductive layers 119, and a plurality of dielectric layers 115 in stack. The first conductive layers 117 and the first conductive vias 119 are both disposed in the dielectric layers 115. The redistribution layer 111 further includes a plurality of contacts 123 electrically connecting the first conductive layers 117 and the first conductive vias 119 of the redistribution layer 111 to the dies 104. In some embodiments, an uppermost layer of the first conductive layers 117 is electrically connected to a plurality of first bumps 121. In some embodiments, the first bumps 121 are disposed over the dies 104 as shown in FIG. 4. However, in some embodiments, the first bumps 121 may also disposed over the molding 106, and form the so-called fan-out packaging structure. In some embodiments, the first bumps 121 are solder balls using, for example, the technology of ball grid array (BGA).

In some embodiments, the first bumps 121 are exposed from the top cooling plate 110 as shown in FIGS. 1A, 1B and 2. Referring to FIGS. 1A, 2 and 3, in some embodiments, the top cooling plate 110 has a grid pattern including a plurality of openings 120 corresponding to the dies 106, and the openings 120 expose the first bumps 121, so that the dies 104 can be connected through the redistribution layer 111 and the first bumps 121 to an outer circuit.

In some embodiments, the dielectric layers 115 include a dielectric material such as an oxide dielectric, for example, a borophosphosilicate glass (BPSG), or any other suitable dielectric material. In some embodiments, the dielectric layer 115 includes a low-k dielectric material. The dielectric constant (k value) of the low-k dielectric material may be lower than 3.0, or lower than about 2.5, and the dielectric material is therefore also referred to as an extreme low-k (ELK) dielectric material. In some embodiments, the first conductive layers 117, the first conductive vias 119, and the contacts 123 include a conductive material such as copper, nickel, aluminum, copper aluminum, tungsten, titanium, or any other suitable material, or a combination thereof, but the disclosure is not limited thereto. In some embodiments, barrier layers (not shown) may be formed between the first conductive layers 117 and the dielectric layers 115, between the first conductive vias 119 and the dielectric layers 115, and between the contacts 123 and the dielectric layers 115. In some embodiments, the first bumps 121 are formed by electrochemical plating (ECP) and/or the like, and may comprise a material such as copper, tin, eutectic solder, lead free solder, nickel, and combinations thereof, but the disclosure is not limited thereto.

As shown in FIG. 4, the detecting component 108 includes a first chain structure 108A and a second chain structure 108B. In some embodiments, the first chain structure 108A and/or the second chain structure 108B form a daisy-chain structure. The first chain structure 108A of the detecting component 108 includes a plurality of second conductive layers 105A in stack around the fixing component 112 and a plurality of second conductive vias 107A coupling the second conductive layers 105A. The second chain structure 108B of the detecting component 108 is disposed at a periphery of the first chain structure 108A, and includes a plurality of third conductive layers 105B in stack and a plurality of third conductive vias 107B coupling the third conductive layers 105B. The first chain structure 108A and the second chain structure 108B of the detecting component 108 are connected to each other by a lowermost conductive layer 113. The first chain structure 108A, the second chain structure 108B and the lowermost conductive layer 113 of the detecting component 108 are disposed in the dielectric layer 115. In some embodiments, the second conductive layers 105A of the first chain structure 108A of the detecting component 108 surround the fixing component 112 from a top surface to a bottom surface of the redistribution layer 111. In some embodiments, the second conductive layers 105A of the first chain structure 108A of the detecting component 108 have the same diameter $D_d$ around the fixing component 112. The detecting component 108 is electrically isolated from the first conductive layers 117 and the first conductive vias 119 of the redistribution layer 111 as shown in FIG. 4. In some embodiments, the second conductive layers 105A and the second conductive vias 107A of the detecting component 108 are electrically isolated from the first conductive layers 117 and the first conductive vias 119 of the redistribution layer 111 by the dielectric layers 115. Moreover, in contrast with the first conductive layers 117 and the first conductive vias 119 of the redistribution layer 111, the second conductive layers 105A and the second conductive vias 107A of the detecting component 108 are electrically isolated from the dies 104 by the dielectric layers 115. Similarly, in some embodiments, the third conductive layers 105B and the third conductive vias 107B of the detecting component 108 are electrically isolated from the first conductive layers 117 and the first conductive vias 119 of the redistribution layer 111, and electrically isolated from the dies 104 by the dielectric layers 115.

FIGS. 5A and 5B illustrate top views of a portion of a semiconductor device cut through a line C-C' and a line D-D', respectively, of FIG. 4, in accordance with some embodiments of the present disclosure. From top views as illustrated in FIGS. 5A and 5B, the first chain structure 108A of the detecting component 108 has a ring shaped structure circling around the fixing component 112, and the second chain structure 108B of the detecting component 108 is located at a periphery of the ring shaped structure of the first chain structure 108A. In some embodiments, the first chain structure 108A of the detecting component 108 is spaced apart from the fixing component 112 by a distance of between approximately 10 μm and approximately 100 μm. In some comparative approaches, when the distance is less than approximately 10 μm, the detecting component 108 may be located too close to drill holes through which the fixing components 112 penetrate. In such case, an operation for making the drill holes needs to be controlled very carefully and control of such operation becomes hard because the detecting components 108 may be damaged during the operation and lose function before use. In some alternative comparative approaches, when the distance is more than approximately 100 μm, the detecting component 108 may be located too far away from the fixing component 112 and sensitivity of detecting a defect near the fixing component 112 may be insufficient.

FIG. 5A illustrates a top view of a portion of the semiconductor device 100 cut through a line C-C' at an upper surface of the packaging structure 102. As shown in FIG. 5A, a first probe pad 502 and a second probe pad 504 are electrically connected to two ends of the detecting component 108. Specifically, the first probe pad 502 is electrically connected to one end of the first chain structure 108A of the detecting component 108, while the second probe pad 504 is electrically to one end of the second chain structure 108B of the detecting component 108. The first probe pad 502 and the second probe pad 504 are disposed at an upper surface of the packaging structure 102. In some embodiments, the first probe pad 502 is electrically connected to one end of the first chain structure 108A through a metal line 506. In some embodiments, the first probe pad 502 and the second probe pad 504 are exposed from the top cooling plate 110, so that a probing device can probe the detecting component 108 through the first probe pad 502 and the second probe pad 504. In some embodiments, the first chain structure 108A of the detecting component 108 is electrically connected to one of the first bumps 121 by a metal line 118 as shown in FIG. 1B. In some embodiments, the metal line 506 shown in FIG. 5A is the metal line 118 shown in FIG. 1B and the first probe pad 502 shown in FIG. 5A is connected to one of the first bumps 121 shown in FIG. 1B. In some embodiments, the second chain structure 108B of the detecting component 108 is electrically connected to one of the first bumps 121 by a metal line 118 shown in FIG. 1B. In some embodiments, the second probe pad 504 is electrically connected to a second bump 131 shown in FIG. 4.

Referring to FIGS. 4, 5A and 5B, in some embodiments, the first probe pad 502, the detecting component 108 and the second probe pad 504 are configured to define a signal path 402. In some embodiments, the signal path 402 starts from the first probe pad 502, goes to an uppermost second conductive layer (e.g., 105A of FIG. 5A) of the first chain structure 108A of the detecting component 108, goes through a second conductive via 107A to an underlying second conductive layer (e.g., 105A of FIG. 5B), goes to another underlying second conductive layer 107A in a similar way until going to the lowermost conductive layer 113, goes through the lowermost conductive layer 113 to the second chain 108B, goes through a third conductive via 107B to an overlying third conductive layer 105B, and goes to another overlying third conductive layer 105B in a similar way until arriving at the second probe pad 504.

In some embodiments, the second and third conductive layers 105A and 105B, the second and third conductive vias 107A and 107B, and the lowermost conductive layer 113 of the detecting components 108 are fabricated together with the first conductive layers 117 and the first conductive vias 119 of the redistribution layer 111. In some embodiments, the first, second and third conductive layers 117, 105A and 105B are formed by depositing an dielectric layer 115, etching a pattern in the dielectric layer 115 using, for example, acceptable photolithography techniques, depositing a conductive material for the first, second and third conductive layers 117, 105A and 105B in the dielectric layers 115, and removing any excess conductive material by, for example, chemical mechanical polishing (CMP). The photolithography techniques may include a single damascene process or a dual damascene process. In some embodiments, the first, second and third conductive layers 117, 105A and 105B, the first, second and third conductive vias 119, 107A and 107B, and the lowermost conductive layer 113, the same or differently, include a conductive material such as copper, nickel, aluminum, copper aluminum, tungsten, titanium, or any other suitable material, or a combination thereof.

Since the detecting components 108 can be fabricated together with the first conductive layers 117 and the first conductive vias 119 of the redistribution layer 111 in accordance with some embodiments of the present disclosure, the introduction of the detecting component 108 would not cause much difficulty to original operations for manufacturing a semiconductor device. The fabrication of the detecting component 108 is compatible with the fabrication of the redistribution layer 111. Accordingly, the detecting components 108 in accordance with the present disclosure are highly processable and compatible with the original design.

Figure 6:
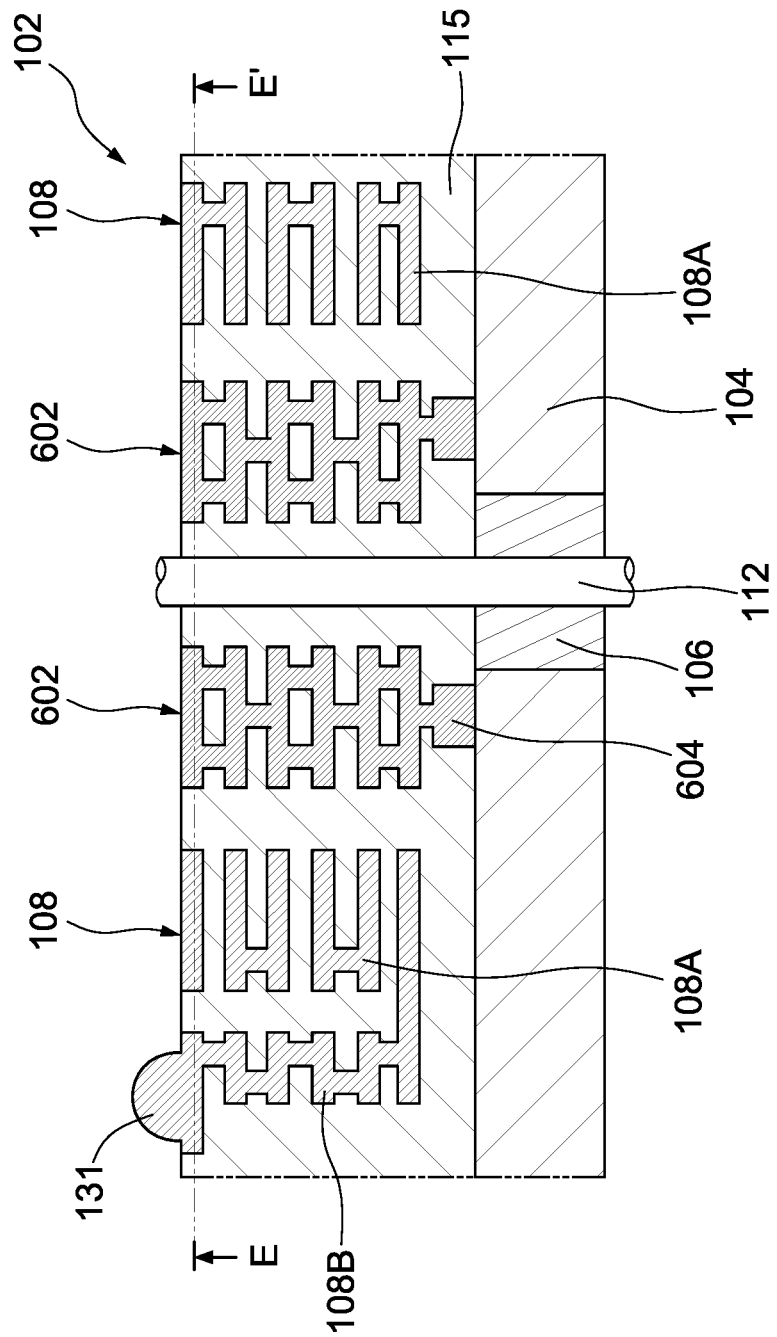
FIG. 6 is a schematic cross-sectional view of a portion of a semiconductor device in accordance with some embodiments of the present disclosure.
Figure 7:
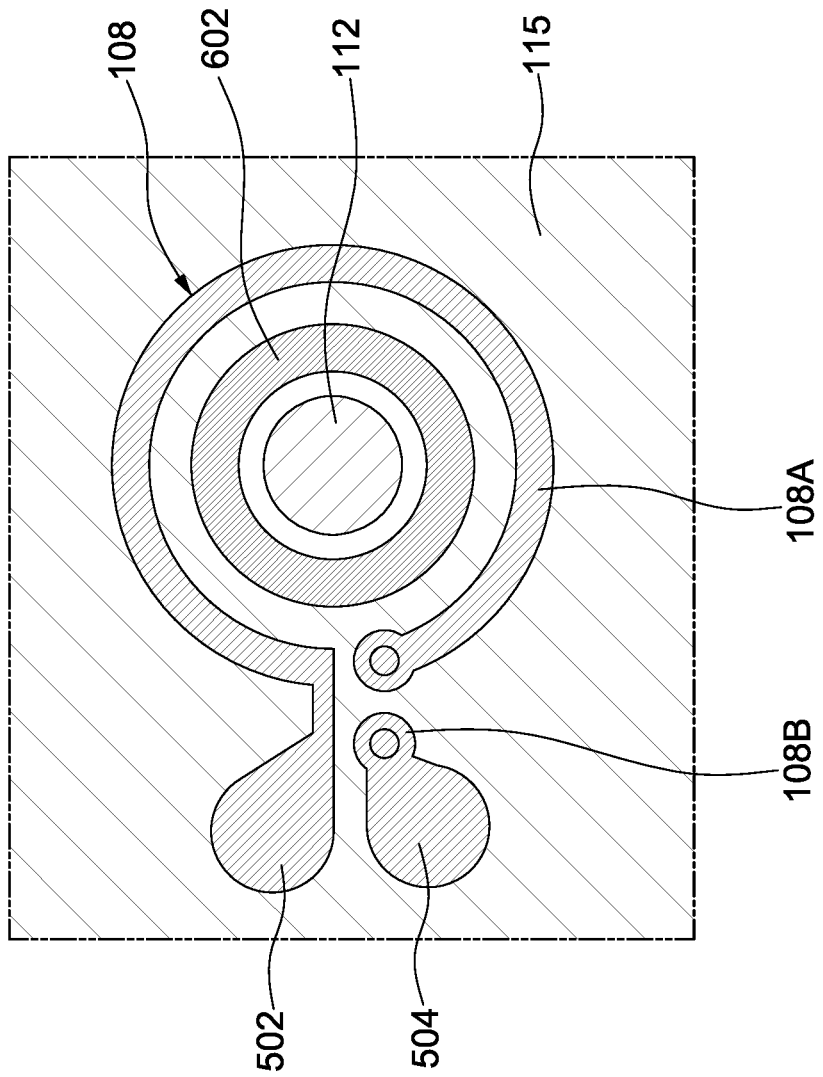
FIG. 7 is a top view of a portion of the semiconductor device cut through a line E-E' illustrated in FIG. 6, in accordance with some embodiments of the present disclosure.

FIG. 6 is a schematic cross-sectional view of a portion of a semiconductor device in accordance with some embodiments of the present disclosure. FIG. 7 is a top view of a portion of the semiconductor device cut through a line E-E' illustrated in FIG. 6. In some embodiments as shown in FIGS. 6 and 7, the packaging structure 102 further includes a seal ring 602 disposed in the dielectric layer 115 and between the fixing component 112 and the detecting component 108. From a top view as illustrated in FIG. 7, the seal ring 602 circles around the fixing components 112. In some embodiments, the fixing component 112, the seal ring 602, and the first chain structure 108A of the detecting component 108 are concentrically disposed. In some embodiments, the seal ring 602 is electrically isolated from the detecting component 108. In some embodiments, the seal ring 602 is electrically isolated from the fixing component 112. In some embodiments, the seal ring 602 is in contact with the dies 104 through contacts 604 as shown in FIG. 6, but the disclosure is not limited thereto.

In some embodiments, the seal ring 602 is formed of metal lines and connecting vias. The seal ring 602 not only provides mechanical support and structural reinforcement to the semiconductor device 100, but also hinders defects, such as cracks, from spreading out from a region adjacent to the fixing component 112. In some embodiments, the seal ring 602 can be made of at least one material, such as copper, aluminum, aluminum copper, aluminum silicon copper, tungsten, titanium, tantalum, titanium nitride, tantalum nitride, nickel silicide, cobalt silicide, any other suitable conductive material, or a combination thereof. It should be noted that the single seal ring 602 shown in FIGS. 6 and 7 is merely illustrative, and the scope of the present disclosure is not limited thereto. In some embodiments, two or more seal rings 602 may be disposed around the fixing components 112.

Figure 8:
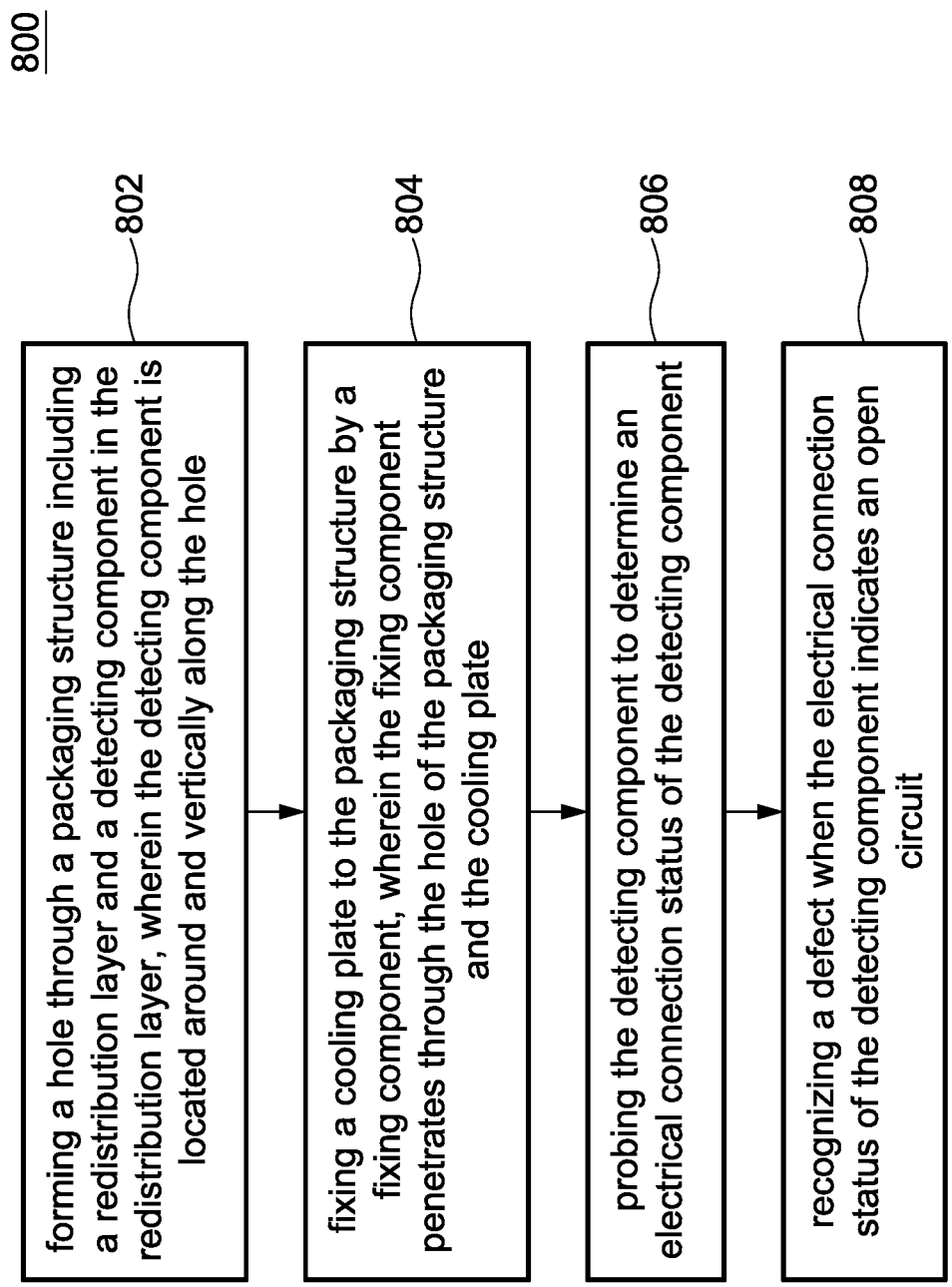
FIG. 8 is a flowchart representing a method for detecting a defect in a semiconductor device in accordance with some embodiments of the present disclosure.

FIG. 8 is a flowchart illustrating a method for detecting a defect in a semiconductor device in accordance with some embodiments of the present disclosure. In some embodiments, the method for detecting a defect in a semiconductor device 800 is used to test the semiconductor device 100 stated above. The method 800 includes an operation 802, in which a hole is formed through a packaging structure. The package structure includes a redistribution layer and a detecting component in the redistribution layer. The detecting device is located around and vertically along a hole. In some embodiments, the package structure is the package structure 102 stated above. In some embodiments, the redistribution layer and the detecting component are the redistribution layer 111 and the detecting component 108, respectively, as stated above. In some embodiments, the hole is drilled by, for example, a laser beam, but the disclosure is not limited thereto. In some embodiments, the hole is formed through the redistribution layer 111 and a molding 106 of the packaging structure 102.

The method 800 further includes an operation 804, in which a cooling plate is fixed to the packaging structure by a fixing component. The fixing component penetrates through the hole of the packaging structure and the cooling plate. In some embodiments, the cooling plate is the top cooling plate 110 stated above. In some embodiment the cooling plate refers to both the top cooling plate 110 and the bottom cooling plate 114 stated above. In some embodiments, the fixing component is the fixing component 112 stated above.

The method 800 further includes an operation 806, in which the detecting component is probed to determine an electrical connection status of the detecting component. In some embodiments, the semiconductor device further includes a first probe pad and a second probe pad electrically connected to two ends of the detecting component, and the electrical connection status of the detecting component is determined by providing a test signal to the first probe pad and detecting the test signal at the second probe pad. In some embodiments, the test signal includes an electrical current, but the disclosure is not limited thereto. In some embodiments, the detecting component is configured to provide a signal path for the test signal. In some embodiments, the signal path is the signal path 402 stated above.

Figure 9:
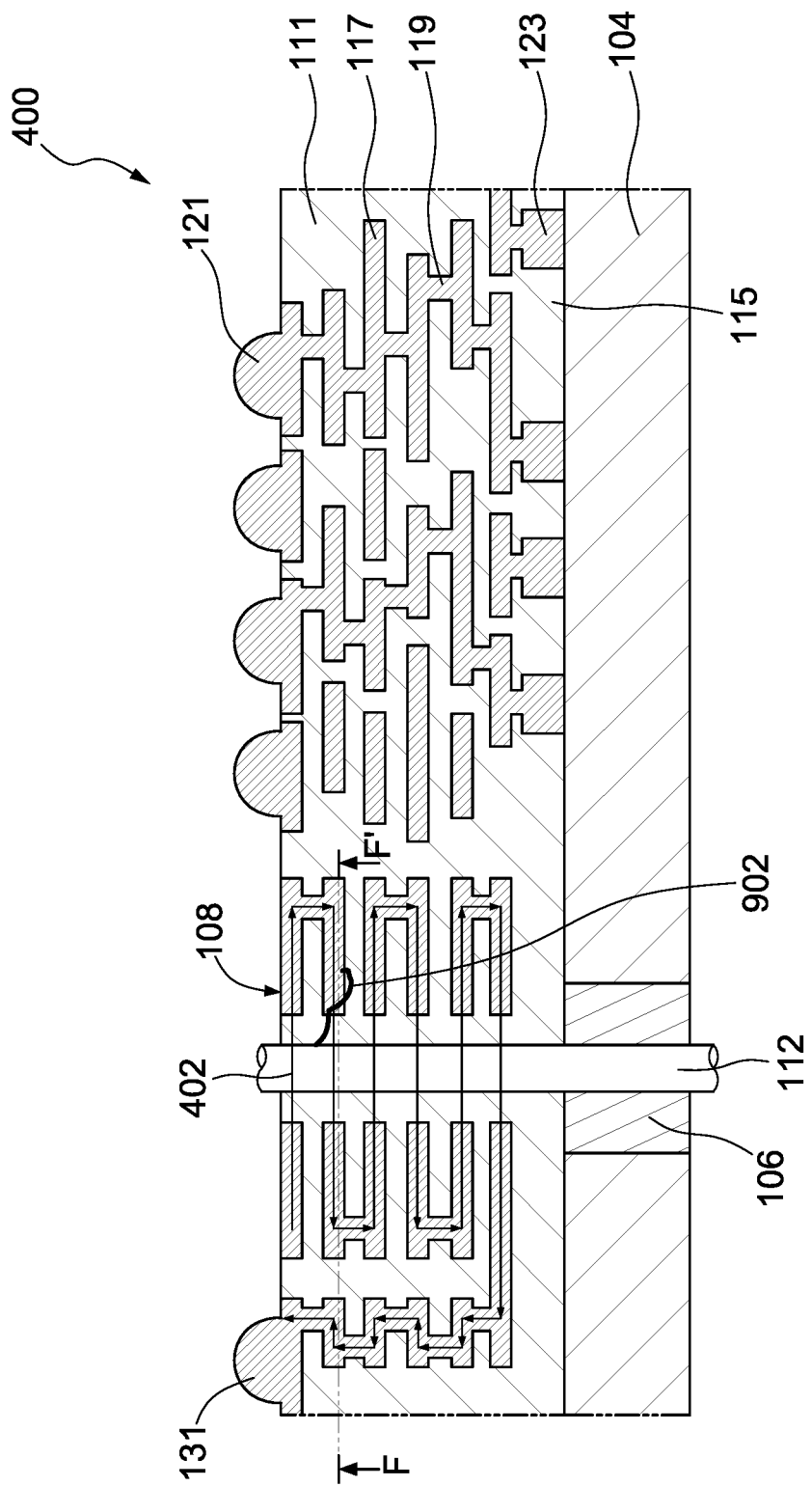
FIG. 9 illustrates a cross-sectional view of a portion of a semiconductor device in accordance with some embodiments of the present disclosure.
Figure 10:
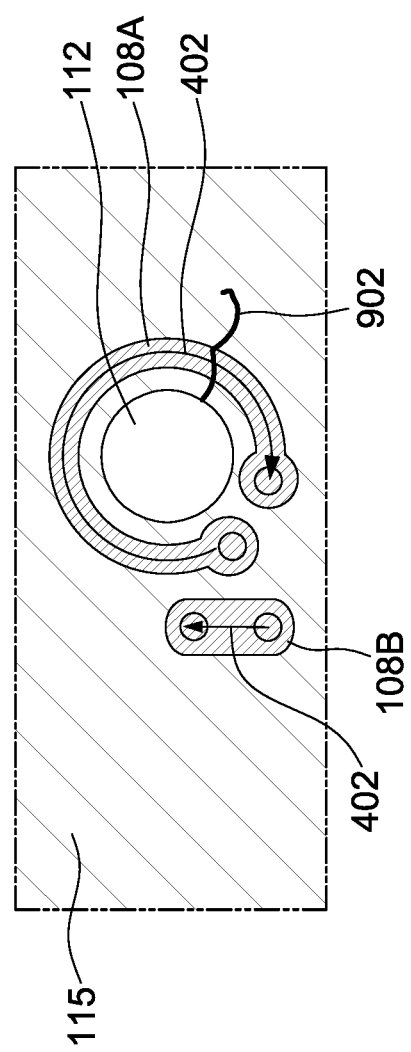
FIG. 10 is a top view of a portion of the semiconductor device cut through a line F-F' illustrated in FIG. 9, in accordance with some embodiments of the present disclosure.

The method 800 further includes an operation 808, in which a defect is recognized when the electrical connection status of the detecting component indicates an open circuit. In some embodiments, the defect includes a crack, but the disclosure not limited thereto. FIG. 9 illustrates a cross-sectional view of a portion of a semiconductor device with a defect in accordance with some embodiments of the present disclosure. FIG. 10 is a top view of a portion of a semiconductor device cut through a line F-F' of FIG. 9. In some embodiments as illustrated in FIG. 9, a defect 902 may occur near the fixing component 112 due to stress when a hole is formed through the packaging structure or when the cooling plate is fixed to the packaging structure or when the semiconductor device undergoes a temperature cycle test. The defect 902 may break the signal path 402 provided by the detecting component 108 as illustrated in FIGS. 9 and 10. In some embodiments, the defect 902 may break the signal path 402 by damaging the first chain structure 108A of the detecting component 108. In such circumstances, the signal path 402 becomes discontinuous, and the test signal cannot be transmitted from the first chain structure 108A to the second chain structure 108B of the detecting component 108. Therefore, the electrical connection status of the detecting component 108 indicates an open circuit, and a defect is recognized. On the contrary, if there is no defect near the fixing component 112 or if the defect is not severe enough to damage the first chain structure 108A of the detecting component 108, the signal path 402 provided by the detecting component 108 is continuous, and the test signal can be transmitted from the first chain structure 108A to the second chain structure 108B. As a result, the electrical connection status of the detecting component 108 indicates a close circuit, and it is recognized that there is no defect or that the defect is tolerable.

Although the method 800 is illustrated as a series of acts or events, it will be appreciated that the present disclosure is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

The present disclosure provides a semiconductor device or a method for detecting a defect in a semiconductor device. The semiconductor device includes a packaging structure, a cooling plate over the packaging structure, and a fixing component configured to fix the cooling plate to the packaging structure. The packaging structure includes a redistribution layer and a detecting component disposed in the redistribution layer. The detecting component is provided around and vertically along the fixing component. The cooling plate allows dissipation of heat from the packaging structure during operation. With the detecting component, it is simple and efficient to electrically detect a defect that may occur in the packaging structure near the fixing component and is hardly observed virtually because it is hidden by the cooling plate or the redistribution layer. The detecting component in accordance with some embodiments of the present disclosure is highly processable and compatible with the fabrication of the redistribution layer since it can be fabricated together with the redistribution layer. In some embodiments, the detecting component is in a chain configuration having a ring shaped structure circling around the fixing component and can be used like a seal ring to hinder a defect from spreading out.

In some embodiments, a semiconductor device is provided. The semiconductor device includes a packaging structure. The packaging structure includes a redistribution layer and a detecting component disposed in the redistribution layer. The semiconductor device further includes a cooling plate over the packaging structure and a fixing component penetrating through the packaging structure and the cooling plate. The packaging structure and the cooling plate are fixed by the fixing component. The detecting component is in a chain configuration having a ring shaped structure circling around the fixing component.

In some embodiments, a semiconductor device is provided. The semiconductor device includes a packaging structure. The packaging structure includes a die, a molding adjacent to the die, and a detecting component over the die and the molding. The semiconductor device further includes a cooling plate over the packaging structure and a fixing component penetrating through the molding of the packaging structure and the cooling plate. The packaging structure and the cooling plate are fixed by the fixing component. The detecting component is disposed around and vertically along the fixing component and electrically isolated from the die of the packaging structure.

In some embodiments, a method for detecting a defect in a semiconductor device is provided. The semiconductor device includes the following operations. A hole is formed through a packaging structure including a redistribution layer and a detecting component disposed in the redistribution layer. The detecting component is located around and vertically along the hole. A cooling plate is fixed to the packaging structure by a fixing component. The fixing component penetrates through the hole of the packaging structure and the cooling plate. The detecting component is probed to determine an electrical connection status of the detecting component. A defect is recognized when the connection status of the detecting component indicates an open circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a packaging structure comprising a redistribution layer and a detecting component disposed in the redistribution layer;
   a cooling plate over the packaging structure; and
   a fixing component penetrating through the packaging structure and the cooling plate, the packaging structure and the cooling plate being fixed by the fixing component, wherein the detecting component is in a chain configuration having a ring shaped structure circling around the fixing component.

2. The semiconductor device of claim 1, wherein the redistribution layer comprises a plurality of first conductive layers in stack and a plurality of first conductive vias coupling the first conductive layers.

3. The semiconductor device of claim 2, wherein the detecting component comprises a plurality of second conductive layers in stack around the fixing component, and a plurality of second conductive vias coupling the second conductive layers.

4. The semiconductor device of claim 3, wherein the second conductive layers and the second conductive vias are isolated from the first conductive layers and the first conductive vias.

5. The semiconductor device of claim 3, wherein the plurality of second conductive layers have the same diameter around the fixing component.

6. The semiconductor device of claim 1, wherein the detecting component comprises a first chain structure and a second chain structure, and wherein the first chain structure has the ring shaped structure circling around the fixing component and the second chain structure is disposed at the periphery of the ring shaped structure.

7. The semiconductor device of claim 1, further comprising a first probe pad and a second probe pad electrically connected to two ends of the detecting component, and wherein the first probe pad and the second probe pad are disposed at an upper surface of the packaging structure.

8. The semiconductor device of claim 7, wherein the first probe pad and the second probe pad are exposed from the cooling plate.

9. The semiconductor device of claim 1, further comprising a seal ring disposed between the fixing component and the detecting component.

10. The semiconductor device of claim 9, wherein the seal ring is electrically isolated from the detecting component.

11. A semiconductor device, comprising:
a packaging structure comprising a die, a molding adjacent to the die, and a detecting component over the die and the molding;
a cooling plate over the packaging structure; and
a fixing component penetrating through the molding of the packaging structure and the cooling plate, the packaging structure and the cooling plate being fixed by the fixing component,
wherein the detecting component is disposed around and vertically along the fixing component and electrically isolated from the die of the packaging structure.

12. The semiconductor device of claim 11, wherein the packaging structure further comprises a redistribution layer over the die and the molding and the detecting component is disposed in the redistribution layer.

13. The semiconductor device of claim 12, wherein the redistribution layer comprises a plurality of first conductive layers in stack and a plurality of first conductive vias coupling the first conductive layers, and the detecting component is electrically isolated from the first conductive layers and the first conductive vias.

14. The semiconductor device of claim 13, wherein the first conductive layers and the first conductive vias are electrically connected to the die.

15. The semiconductor device of claim 11, wherein the packaging structure further comprises a bump over the die, and wherein one end of the detecting component is electrically connected to the bump.

16. The semiconductor device of claim 15, wherein the cooling plate comprises an opening through the cooling plate, and wherein the opening exposes the bump.

17. The semiconductor device of claim 11, wherein the packaging structure further comprises a seal ring between the fixing component and the detecting component, and wherein the seal ring contacts the die.

18. A method for detecting a defect in a semiconductor device, comprising:
forming a hole through a packaging structure comprising a redistribution layer and a detecting component disposed in the redistribution layer, wherein the detecting component is located around and vertically along a hole;
fixing a cooling plate to the packaging structure by a fixing component, wherein the fixing component penetrates through the hole of the packaging structure and the cooling plate;
probing the detecting component to determine an electrical connection status of the detecting component; and
recognizing a defect when the connection status of the detecting component indicates an open circuit.

19. The method of claim 18, wherein the semiconductor device further comprises a first probe pad and a second probe pad electrically connected to two ends of the detecting component, and the connection status of the detecting component is determined by providing a test signal to the first probe pad and detecting the test signal at the second probe pad.

20. The method of claim 19, wherein the first probe pad, the detecting component and the second probe pad are configured to transmit the test signal from the first probe pad to an uppermost conductive layer of the detecting device, from the uppermost conductive layer to a lowermost conductive layer of the detecting component, and from the lowermost conductive layer of the detecting component to the second probe pad.

* * * * *